United States Patent [19]

Haneda et al.

[11] Patent Number: 5,724,612
[45] Date of Patent: Mar. 3, 1998

[54] INFORMATION TRANSFER APPARATUS AND INFORMATION RECORDING APPARATUS INCLUDING TRANSFER CONTROL MEANS FOR DETERMINING A TRANSFER SEQUENCE OF PLURAL INFORMATION BLOCKS

[75] Inventors: Naoya Haneda, Tokyo; Kyoya Tsutsui, Kanagawa, both of Japan

[73] Assignee: Sony Corporation, Tokyo, Japan

[21] Appl. No.: 346,413

[22] Filed: Nov. 29, 1994

[30] Foreign Application Priority Data

Nov. 29, 1993 [JP] Japan .................................. 5-298303

[51] Int. Cl.$^6$ .................................................. G06F 13/00
[52] U.S. Cl. .......................... 395/853; 395/854; 395/855; 395/849; 395/430
[58] Field of Search ................................. 395/853, 854, 395/855, 842, 421.08, 849, 824, 844, 421.07, 825, 826, 430

[56] References Cited

U.S. PATENT DOCUMENTS

| | | | |
|---|---|---|---|
| 4,764,895 | 8/1988 | Armstrong | 395/421.08 |
| 4,872,073 | 10/1989 | Fincher et al. | 360/51 |
| 5,170,469 | 12/1992 | Sako et al. | 395/854 |
| 5,261,046 | 11/1993 | Shope et al. | 395/162 |
| 5,335,328 | 8/1994 | Dunn et al. | 395/853 |

FOREIGN PATENT DOCUMENTS

| | | | |
|---|---|---|---|
| 6-131371 | 5/1994 | Japan . | |
| 6-215010 | 8/1994 | Japan | G06F 15/21 |

OTHER PUBLICATIONS

English language equivalent corresponding to Japan Patent Laid–Open Publication 6–131371
English language equivalent corresponding to PCT International Application No. JP94/00642

*Primary Examiner*—Jack B. Harvey
*Assistant Examiner*—Ario Etienne
*Attorney, Agent, or Firm*—Limbach & Limbach L.L.P.

[57] ABSTRACT

An apparatus for recording the transfer information transferred to it includes a plurality of recording media for recording the transfer information transferred from an information transfer apparatus, a writing control unit for controlling the writing of the transfer information in the recording media, and a transfer control unit for transmitting the transfer control information and an information transfer request signal to the information transfer apparatus. The transfer control information is the information for determining the transfer sequence of information blocks when the information transfer apparatus transmits the transfer information as the information blocks. The information recording apparatus transmits an information transfer request signal after transmitting the transfer control information to the information transfer apparatus. In this manner, the information recording apparatus receives the transfer information transmitted from the transfer apparatus on an information block basis and records the transfer information on the information block basis on plural recording media. It becomes possible in this manner to record information data on plural recording media not having a uniform writing speed from one recording unit to another, such as a flash memory, by parallel writing in a regular sequence, for enabling highly efficient information transfer by simplified control.

8 Claims, 13 Drawing Sheets

INFORMATION BLOCK D

| D185 |
| D184 |
| D183 |
| D182 |
| ⋮ |
| D11 |
| D10 |
| D9 |
| D8 |
| D7 |
| D6 |
| D5 |
| D4 |
| D3 |
| D2 |
| D1 |
| D0 |

FIG.6A (PRIOR ART)

RECORDING MEDIUM 133

| M63 | ///// |
| M62 | ///// |
| M61 | ///// |
| M60 | ///// |
| M59 | ///// |
| M58 | ///// |
| M57 | D185 |
| ⋮ | ⋮ |
| M1 | D129 |
| M0 | D128 |

FIG.6D (PRIOR ART)

RECORDING MEDIUM 132

| M63 | D127 |
| M62 | D126 |
| M61 | D125 |
| M60 | D124 |
| M59 | D123 |
| ⋮ | ⋮ |
| M3 | D67 |
| M2 | D66 |
| M1 | D65 |
| M0 | D64 |

FIG.6C (PRIOR ART)

RECORDING MEDIUM 131

| M63 | D63 |
| M62 | D62 |
| M61 | D61 |
| M60 | D60 |
| M59 | D59 |
| ⋮ | ⋮ |
| M3 | D3 |
| M2 | D2 |
| M1 | D1 |
| M0 | D0 |

INFORMATION TRANSFER APPARATUS AND INFORMATION RECORDING APPARATUS INCLUDING TRANSFER CONTROL MEANS FOR DETERMINING A TRANSFER SEQUENCE OF PLURAL INFORMATION BLOCKS

BACKGROUND OF THE INVENTION

This invention relates to a variety of information recording apparatus having a nonuniform writing speed and an information transfer apparatus conveniently employed for transferring the information at an elevated speed to the various information recording apparatus.

In JP Patent Kokai (Laid-Open) Publications A-6-131371 and A-6-215010, the present Assignee has proposed an information transfer apparatus for transferring the information, such as speech information, from an information supply source at an elevated speed to a recording apparatus or recording/reproducing apparatus having a semiconductor memory enclosed therein.

FIG. 1 shows the appearance of an embodiment of an information recording and/or reproducing apparatus 200 exploiting such technique.

The apparatus shown in FIG. 1 includes a terminal 201 for connection to an information transfer apparatus. The information may be copied from the information transfer apparatus via this terminal 201 to a recording medium provided within the information recording/reproducing apparatus 200.

The apparatus 200 shown in FIG. 1 includes a display unit 202 and a plurality of button switches 203. The contents of the information recorded on the recording medium may be displayed on the display unit 202. It is possible for the user of the apparatus 200 to selectively reproduce the necessary information, using one of the button switches 203, based upon the display contents on the display unit 202. There is no particular limitation to the contents of the information which may be text information, speech information, video information, computer programs or the like. Program reproduction herein means execution of the program. It is however possible for the user to input the information if necessary. If reproduced signals are text information or video information, it may be displayed on the display unit 202. If they are speech or audio information, the speech or audio signals based on the speech or audio information may be outputted via an earphone 204.

Although not shown in the embodiment of FIG. 1, it is possible to provide a speaker in lieu of or in addition to an earphone 204, in which case the speech or audio signals based on the speech or audio information may be outputted via the speaker.

Similarly, although not shown in the embodiment of FIG. 1, reproduced signals may be coupled to an external display unit or a speaker using an external terminal. Although there is no particular limitation to the type of the recording media, a semiconductor memory, which permits high-speed duplication and random access and which is facilitated in transportation, may be conveniently employed.

FIG. 2 shows an alternate arrangement employing the above technique. The present arrangement corresponds to the information recording/reproducing apparatus of FIG. 1 in which an information recording unit 210 is physically separated from an information reproducing unit 220. Since it becomes necessary during reproduction to transmit data

2 and control signals between the information recording unit and the information reproducing unit 220, the units 210, 220 are provided with terminals interconnecting these units. A connection terminal 211 for connection to the information transfer apparatus and a connection terminal 212 for connection to the information reproducing apparatus, provided on the information recording unit 210, may be unified into one terminal employed commutatively. With the arrangement shown in FIG. 2, the information from the information recording unit 210 may be transmitted to the information reproducing unit 220 by inserting the information recording unit 210 into an insertion/takeout opening 221 formed in the information reproducing unit 220.

FIG. 3 shows, in a perspective view, a practical construction of an information transfer apparatus 230 exploiting the above technique. A recording medium, having the information recorded thereon, is contained in the information transfer apparatus 230. Although not shown in FIG. 3, transmission over wire or radio transmission may be utilized for transmitting the recording information. It is naturally possible to get the pre-recorded recording medium mounted within the apparatus 230.

The apparatus 230, shown in FIG. 3, includes display sections 232 for displaying the pricing or contents of the recorded information and button switches 231 for selecting which information is to be outputted from the apparatus 230. The user desirous to procure the information thrusts a desired one of the button switches 231 by having reference to the contents displayed on the display sections 230. The information may be procured by inserting the information recording/reproducing unit or the information recording unit the user possesses into an insertion/takeout opening 234 of the information transfer apparatus 230 in order to procure a copy.

FIG. 4 shows, in a perspective view, another concrete example of the information transfer apparatus exploiting the above technique. With this apparatus, an insertion opening 241 is separated some distance from a takeout opening 242, such that a user desirous to procure the information H is able to procure it as he or she walks in a direction indicated by arrow A in FIG. 4. An information recording unit 243, inserted at the inserting opening 241, is transported within the information transfer apparatus 240 in a direction indicated by arrow a by a transporting device, not shown, within the information transfer apparatus 240, as the information is copied from the information transfer apparatus 240 to the information recording unit 243. The information recording unit 240 is then discharged at the takeout opening 242. This information transfer apparatus is convenient for promptly furnishing the information to a large number of users.

FIG. 5 is a block circuit diagram showing a practical arrangement for transferring the information from the information transfer apparatus 230 of FIG. 3 to the information recording unit 210 shown in FIG. 2.

The information read out from a recording medium 111 contained in the information transfer apparatus 230 is transferred via a transfer control circuit 112 to write control means 121 within the information recording unit 210. The write control means 121 causes the recorded information to be sequentially written on recording media 131 to 133 for completing the information transfer from the information transfer apparatus 230 to the information recording unit 210. The information is reproduced from the recording media 131 to 133 and transferred via an terminal 103 to the reproducing unit under control by readout control means 141.

FIG. 6 shows typical recording states for the recording media 131 to 133 shown in FIG. 5.

In the present example, information data $D_0$ to $D_{185}$ of 186 information blocks shown in FIG. 6A are recorded on three recording media 131, 132 and 133. The information block herein means an information unit of, for example, 512 bytes. Each of the recording media 131 to 133 has a recording region for storing the information for 64 information blocks shown in FIGS. 6B, 6C and 6D (memory blocks M0 to M63). The information data $D_0$ to $D_{63}$ of from the 0'th information block to the 63rd information block of FIG. 6A are stored in the memory blocks of 0'th memory block M0 up to the 63rd memory block M63 of the recording medium 131, while the information data $D_{64}$ to $D_{127}$ of from the 64th information block to the 127th information block of FIG. 6A are stored in the memory blocks of 0'th memory block M0 up to the 63rd memory block M63 of the recording medium 132 and the information data $D_{128}$ to $D_{185}$ of from the 128th information block to the 185th information block of FIG. 6A are stored in the memory blocks of 0'th memory block M0 up to the 57th memory block M57 of the recording medium 133.

A semiconductor memory enclosed within the information recording unit for which portability is required is conveniently a non-volatile memory not in need of the battery backup because there is no inconvenience of inadvertent erasure of the recorded information. For such non-volatile memory, EEPROMs as described in, for example, "LARGE CAPACITY NON-VOLATILE MEMORY" by Ito et al. in TOSHIBA REVIEW 1990 vol.45 No.11 pp. 870 to 873 and "4M BIT NAND EEPROM HAVING MINIMUM CHIP AREA" BY Masuoka in DENSHI GIJUTSU 1990–11, pp.23 to 27, may be employed.

However, with customary EEPROMs, it takes a longer time for writing than with volatile memories. Consequently, if the information transmitted from the information transfer apparatus is sequentially recorded, the information transfer time is inconveniently prolonged. Besides, with the above-mentioned EEPROMs, the constituent memory elements exhibit variation in characteristics, such that writing in each memory device is not necessarily completed within a pre-set time.

For eliminating out the above inconvenience, the present Assignee has proposed in an unpublished international application PCT/JP94/00642 an apparatus for writing the information in parallel on an information recording apparatus made up of plural recording media for transferring the information at an elevated speed to an information recording apparatus. With the use of this apparatus, the information transfer may be completed at an extremely high speed even if such a recording medium is employed in which the writing time is markedly varied from one memory device to another.

If the information is written in parallel from the information transfer apparatus on the information recording unit made up of plural recording media, it is desirable for the interface between the information transfer apparatus and the information recording unit to be as simple as possible in structure and be able to cope with variable constructions of the recording medium.

However, with the method disclosed in the international application PCT/JP94/00642, it is necessary to transmit at all times the information designating the unit of transmission of the information from the information recording unit to the information transfer apparatus, such that complicated control operations are necessitated. In addition, since the transfer sequence of the information is changed depending upon writing characteristics of the recording media contained in the information recording apparatus, the information transfer apparatus needs to have the ability of transferring the information in a random sequence.

Thus, with the above-described information transfer apparatus and the information recording unit, the control information is transmitted and received for each information transfer operation, thus raising the costs in the controller or the transmitting/receiving section. In addition, the recording medium within the information transfer apparatus tends to be costly because the recording medium capable of a high-speed operation and random accessing needs to be employed.

Meanwhile, the recording density of the semiconductor memory is increasing year by year and, with increase in the recording density, the information recording unit of the same recording capacity may be realized using a smaller number of the recording media. Consequently, there may be occasions wherein the conventional information transfer apparatus cannot meet the wide variety of types of the application and usage employing a wide variety of recording media.

OBJECT AND SUMMARY OF THE INVENTION

In view of the foregoing, it is an object of the present invention to provide an information transfer apparatus capable of facilitated supply of information to an information recording unit employing a wide variety of recording media.

In one aspect, the present invention provides an apparatus for transferring information comprising a recording medium having transfer information recorded thereon, and transfer control means for determining the transfer sequence of plural information blocks when the transfer information recorded on the recording medium is read out as the information blocks based upon the transfer control information received from an information recording unit. The transfer control means transmits the information blocks to the information recording unit in accordance with the determined transfer sequence.

In another aspect, the present invention provides an apparatus for recording the transfer information transferred to it including a plurality of recording media for recording the transfer information transferred from an information transfer apparatus, a writing control unit for controlling the writing of the transfer information in the recording media, and transfer control means for transmitting the transfer control information and an information transfer request signal to the information transfer apparatus. In this manner, the information recording apparatus receives the transfer information transmitted from the transfer apparatus on the information block basis and records the transfer information on the information block basis on plural recording media. It becomes possible in this manner to record information data on plural recording media not having a uniform writing speed from one recording unit to another, such as a flash memory, by parallel writing in a regular sequence, thereby enabling highly efficient information transfer by simplified control. The information recording unit constituted by variable types of the recording media may be readily coped with. The electrical voltage applied to the recording media other than the recording medium being controlled may be lowered for lowering the power consumption. Information management in the information recording unit may be facilitated by having the information data in the plural recording media arrayed contiguously across the recording media after the end of information transfer.

DESCRIPTION OF THE PREFERRED EMBODIMENTS

FIGS. 6A–6D illustrate the conventional information recording method.

DESCRIPTION OF PREFERRED EMBODIMENTS

Figure 1:
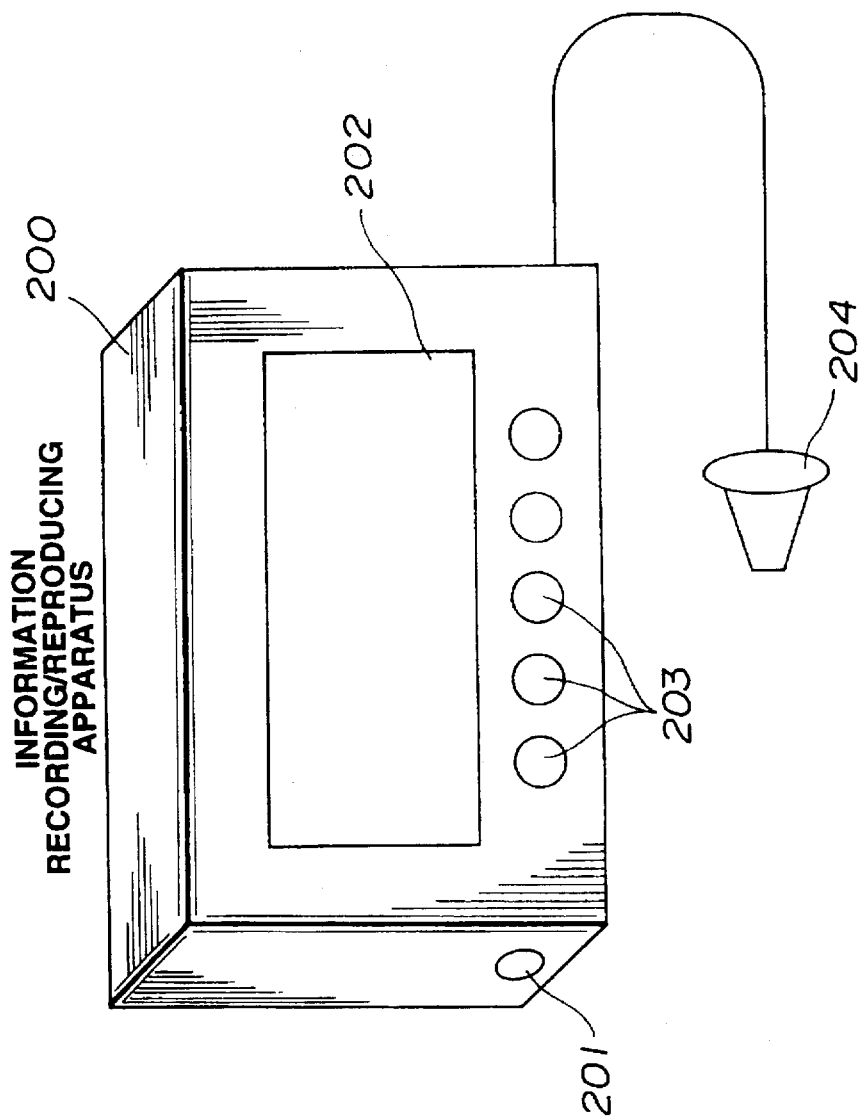
FIG. 1 is a perspective view showing an information recording/reproducing apparatus.
Figure 2:
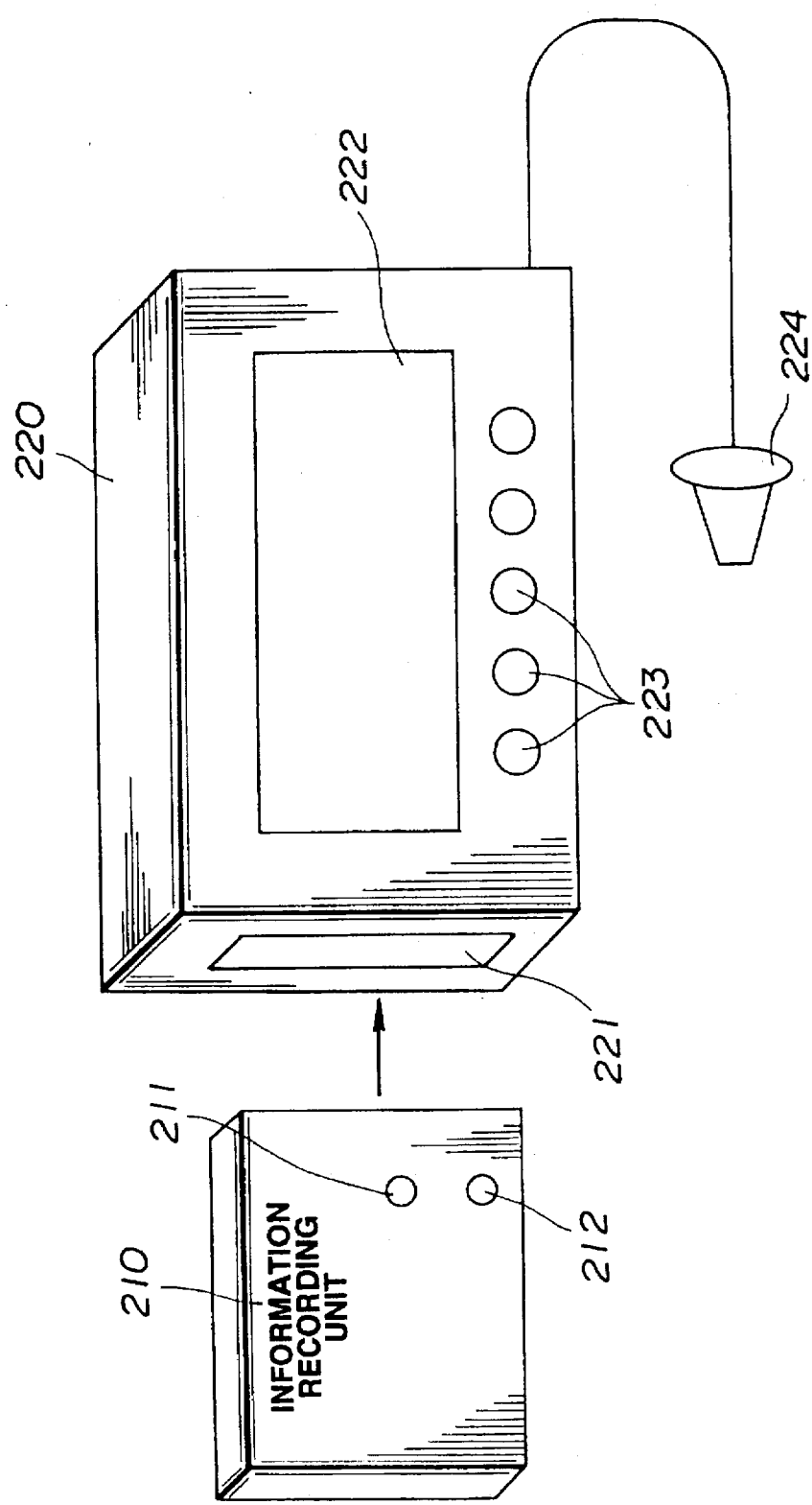
FIG. 2 is a perspective view showing an information recording unit and an information reproducing unit.
Figure 3:
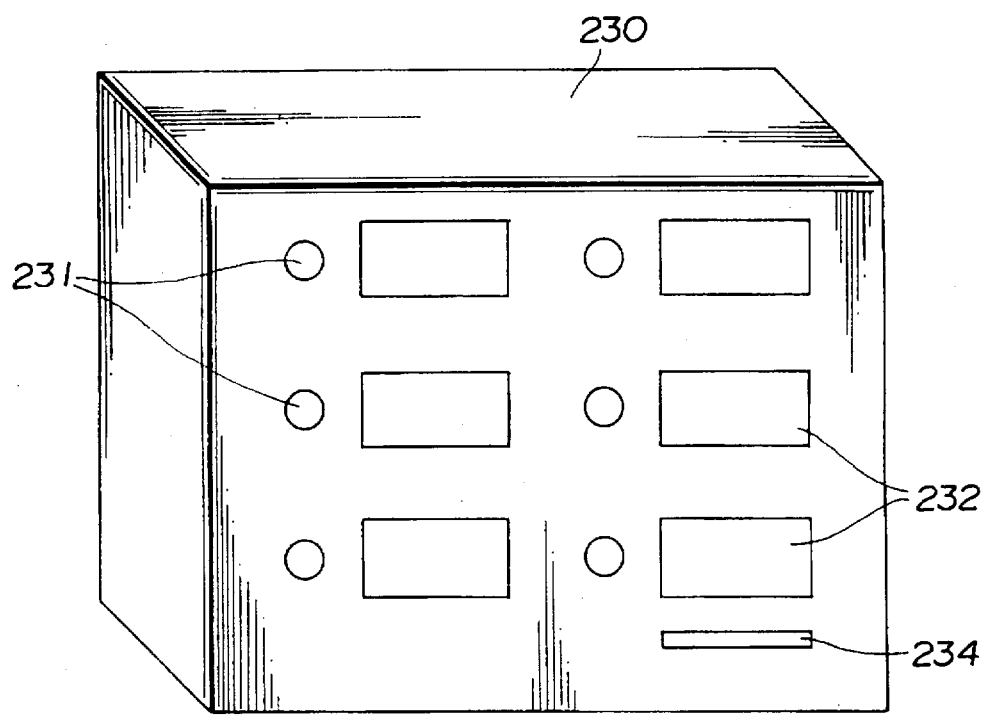
FIG. 3 is a perspective view showing an information transfer apparatus.
Figure 4:
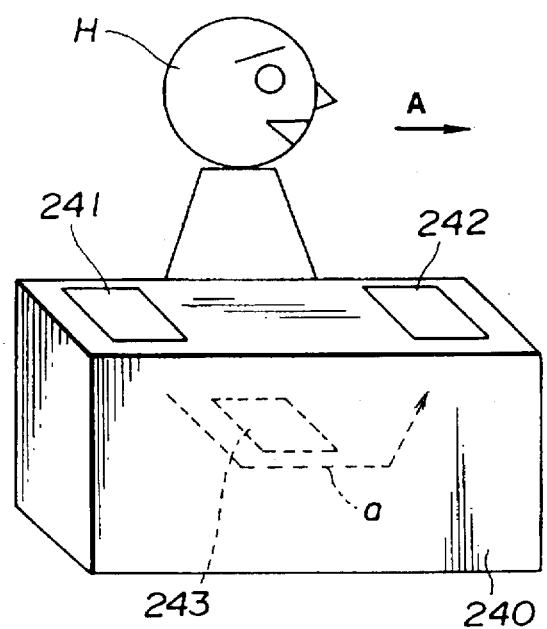
FIG. 4 is a perspective view of another information transfer apparatus.
Figure 5:
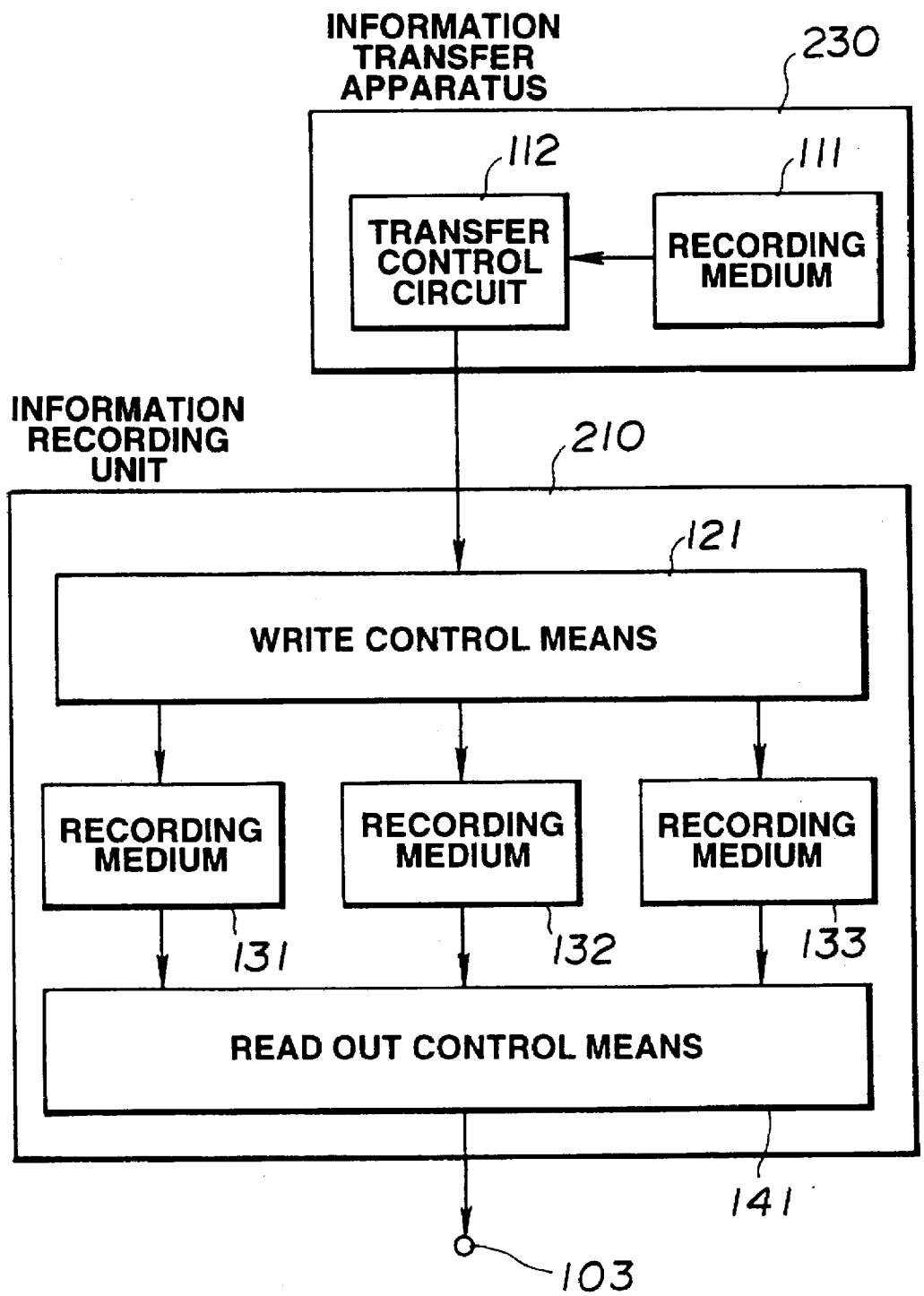
FIG. 5 is a schematic block circuit diagram showing an information recording unit and an information transfer apparatus according to the prior art.

Referring to the drawings, preferred embodiments of the present invention will be explained in detail.

Figure 7:
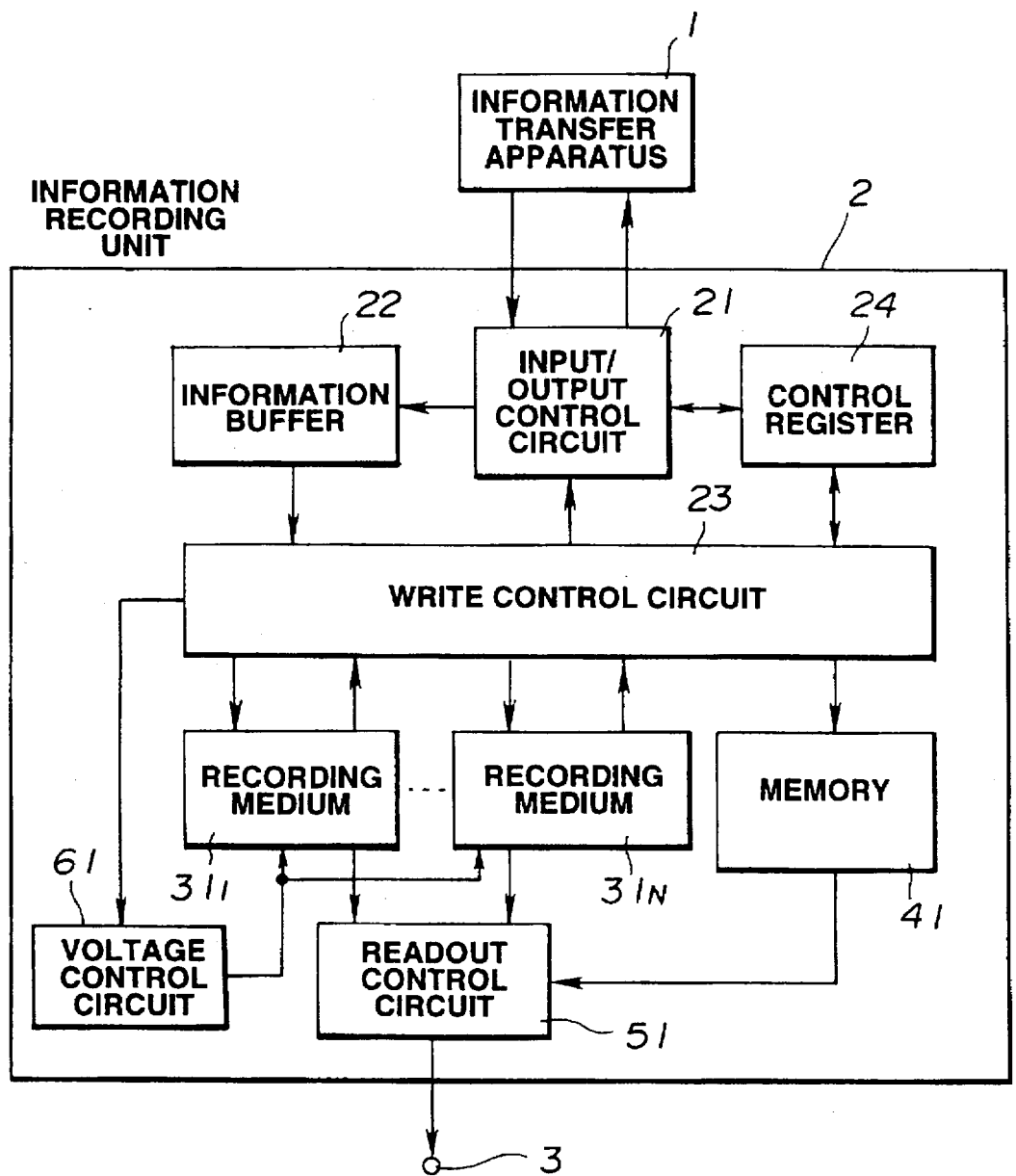
FIG. 7 is a schematic block circuit diagram showing an information recording unit and an information transfer apparatus according to an embodiment of the present invention.

Reference is first made to FIG. 7 schematically showing an arrangement of the information recording unit embodying the present invention along with an information transfer apparatus according to the present invention.

In the information recording unit 2, shown in FIG. 7, information transfer is started with transmission to an information transfer unit 1 of an information transfer demand signal from an input/output control circuit 21 provided within the information recording unit 2.

The information transfer unit 1 is responsive to such demand to transmit the information block to an information buffer memory 22 via an input/output control circuit 21. The information of the information blocks transiently recorded in the information buffer 22 is written in parallel in plural recording media $31_1$ to $31_N$ by a write control circuit 23. The number of the recording media ranges from 1 to N. The information block herein means a group of the information transferred responsive to a information transfer demand signal.

Meanwhile, there is variation in time required in writing in memory blocks of each of the recording media $31_1$ to $31_N$, such that it cannot be insured whether correct writing comes to a close after lapse of a pre-set time. It is however possible to read out the written contents to check into possible coincidence between the written contents and the information to be written in order to verify whether or not writing has been completed successfully. The method of improving the writing reliability by repeating the writing and verification up to a pre-set number of times in case of non-feasibility of correct writing is disclosed in the above-cited publications "LARGE CAPACITY NON-VOLATILE MEMORY" and "4M BIT NAND EEPROM HAVING MINIMUM CHIP AREA".

In the present embodiment, the above-mentioned functions are enclosed in the recording media $31_1$ to $31_N$, and the information concerning whether or not correct recording has been completed is sent from the recording media $31_1$ to $31_N$ to the writing control circuit 23.

The writing control circuit 28 records the recording information as to the possible validity of the information blocks of the recording media $31_1$ to $31_N$ in a recording information memory 41. In case of failure in writing in the recording media, the writing control circuit 23 causes data of the information block, for which the writing has resulted in failure, to be recorded in another memory block, and simultaneously records in the recording information memory 41 the information indicating that such exceptional writing has been made. After completion of the data writing in the information blocks of the recording media $31_1$ to $31_N$, the information of the memory block number in the recording media $31_1$ to $31_N$ in which to write data next is recorded by the writing control circuit 23 in the control register 24. Consequently, the input/output control circuit 21 places a demand for information transfer based upon the state of the control register 24.

The above operation is repeated until completion of the demanded information in its entirety.

During information reproduction, the readout control circuit 51 reads out the information from the recording media $31_1$ to $31_N$, based upon the recording information recorded in the recording information memory 41, and transmits the read-out information via an output terminal 3 to the information reproducing unit.

Figure 8C:
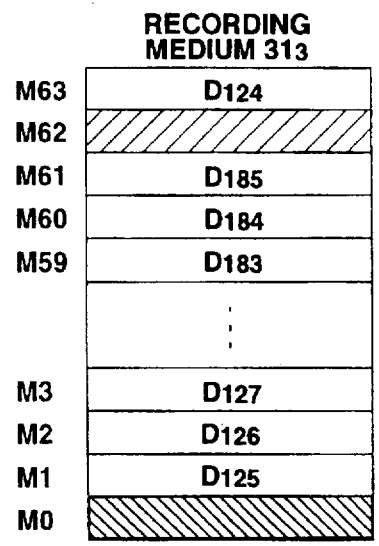
FIGS. 8A–8C are a memory map for illustrating the operation in the recording information recording means in the information recording unit of the present embodiment.
Figure 8B:
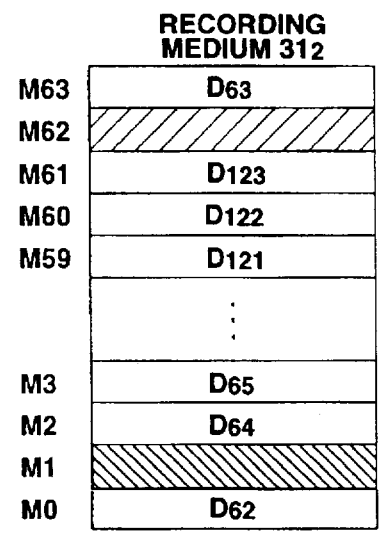
Figure 8A:
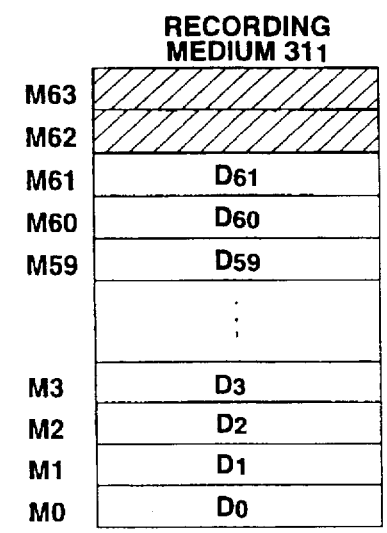
Figures 9, 14:
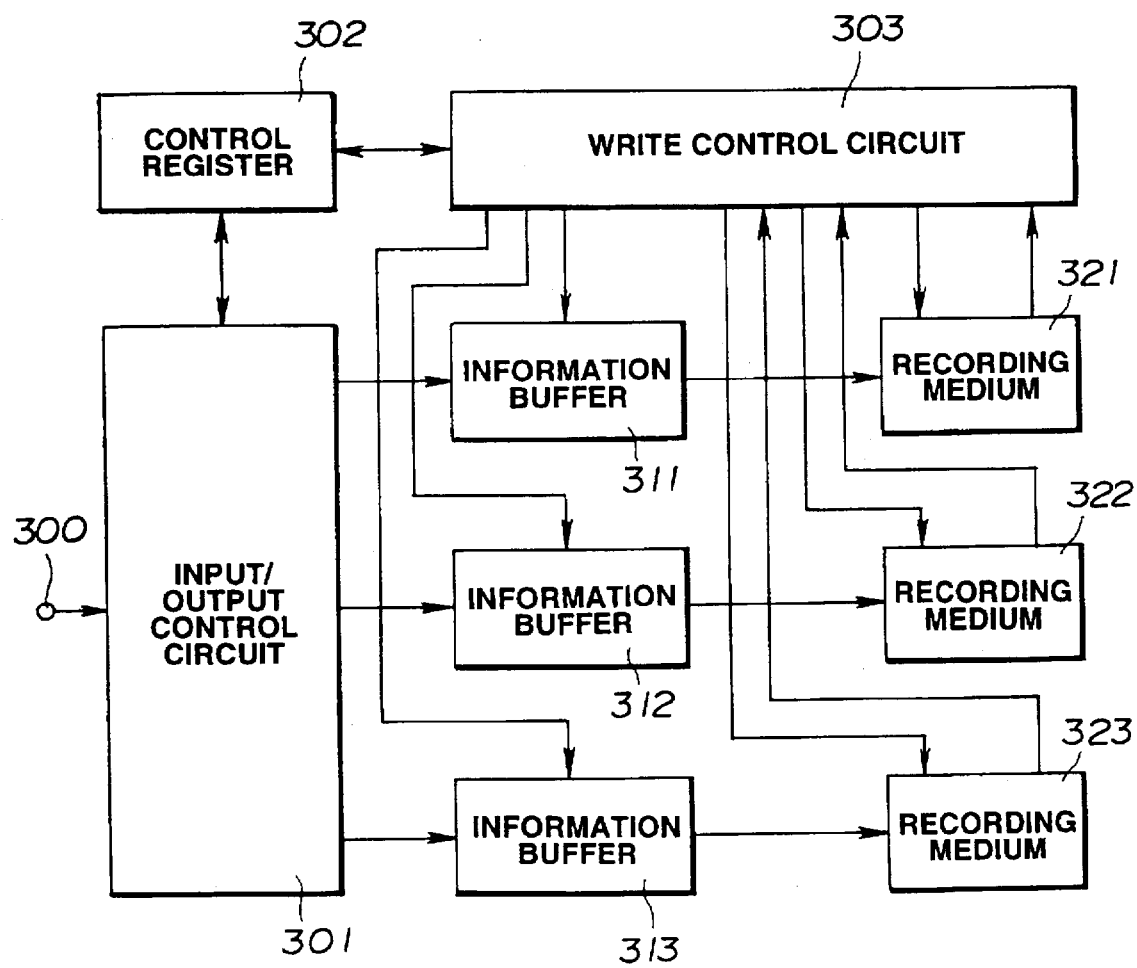
FIG. 9 is a memory map for illustrating the operation of the recording information recording means in the information recording unit of the present embodiment.
FIG. 14 is a block diagram of an alternative to the information buffer 22.

FIGS. 8A to 8C show that the information for 186 information blocks shown in FIG. 6A has been recorded in, for example, three recording media $31_1$, $31_2$ and $31_3$. FIG. 9 shows an example of the information recorded in the recording information memory 41 of the information recording unit 2.

In the present example, the information of the 186 information blocks such as those shown in FIG. 6A is recorded across the three recording media $31_1$, $31_2$ and $31_3$. The first memory block M1 of the recording medium $31_2$ or the 0'th memory block M0 of the recording medium $31_3$ are those memory blocks where correct writing has not been made. The 62nd memory block M82 and the 63rd memory block M63 of the recording medium $31_1$, the 62nd memory block M62 of the recording medium $31_2$ and the 62nd memory block M62 of the recording medium $31_3$ are those memory blocks where information has not been written. Each of the recording media $31_1$, $31_2$ and $31_3$ is capable of storing 64 blocks of the information, such that the information from the 0'th information block up to the 185th information block, such as those shown in FIG. 6A, is recorded across the three recording media $31_1$, $31_2$ and $31_3$ in their entirety, provided that writing can be made correctly in the recording media $31_1$, $31_2$ and $31_3$. In the present-example, shown in FIG. 8, the numbers of the information blocks recorded in the recording media $31_1$, $31_2$ and $31_3$ are consecutive. The merit of recording in this sequence will be explained subsequently.

If recording in a given memory block has not been completed within a pro-set time, the information of the information block which should have been recorded in the memory block is written in some other memory block, and the effect that such exceptional writing has been made is recorded in the recording information memory 41.

In the recording information memory 41, there is recorded the information indicating that such exceptional recording has been made. In even addresses and odd addresses of the storage area in the recording information memory 41, there is recorded the information indicating the position of the memory block in which the information of the information block should inherently be recorded and the information indicating the position of the memory block in which the information of the information block has actually been recorded, as shown for example in FIG. 9.

In the example of FIG. 9, the effect that the information of the 124th information block which should have been recorded in the 0'th memory block M0 of the recording medium $31_3$ has now been recorded in the 63rd memory block M63 of the recording medium $31_3$ is recorded in the 0'th address m0 and in the first address m1 of the storage area of the recording information memory 41. Also, the effect that the information of the 63rd information block which should have been recorded in the first memory block M1 of the recording medium $31_2$ has now been recorded in the 63rd memory block M63 of the recording medium $31_2$ is recorded in the second address m2 and in the third address m3 of the storage area of the recording information memory 41. In addition, the information $e^{-1}$ indicating that the exceptional recording has been made only in these two memory blocks, such as the information −1, is recorded in a fourth address m4 of the recording information memory 41.

The information concerning such exceptional writing is recorded in the recording information memory 41 at a time point when such recording has been made. In the present example, when writing is exceptionally made at a position other than the inherent recording position, recording is sequentially made beginning from the trailing end of a vacant region. This is convenient in that the recording region is not used wastefully and the recording position can be fixed irrespective of the written length of the information. There are a variety of alternative methods for dealing with incorrect writing in the recording devices. Examples of these alternative methods are described in the International Application PCT/JP94/00642 previously proposed by the present Assignee.

Figure 10:
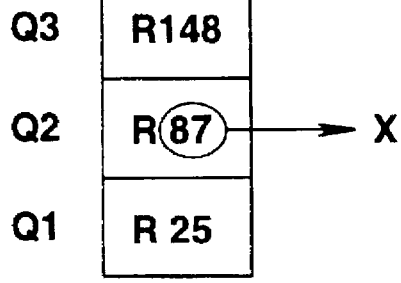
FIG. 10 illustrates the operation of a control register in the information transfer apparatus of the present embodiment.
Figure 10:
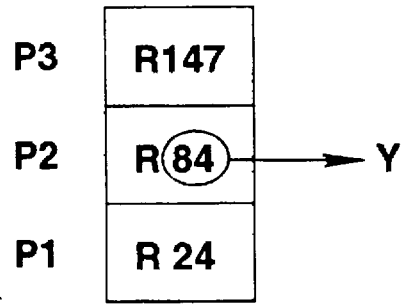
Figure 10:
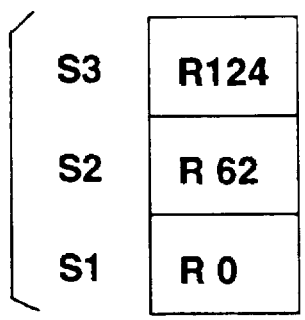
Figure 11:
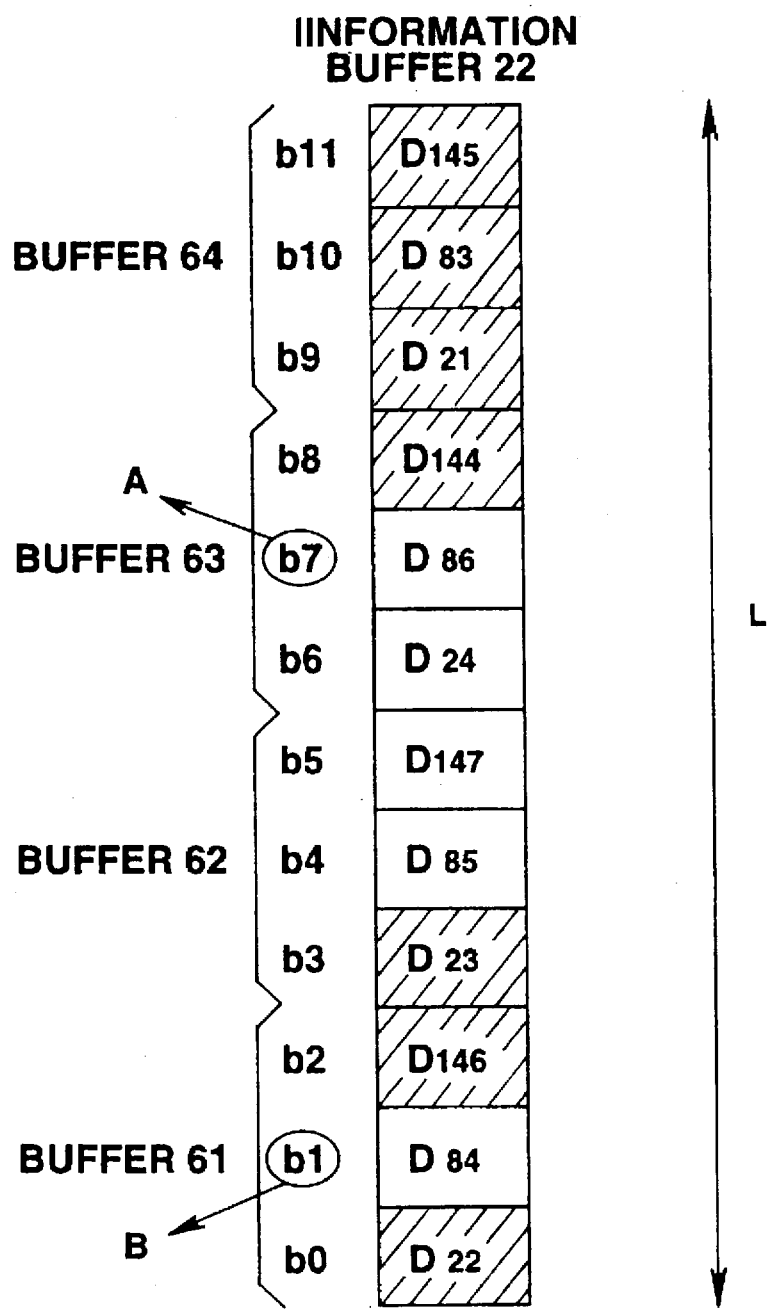
FIG. 11 illustrates the operation of an information buffer of the information transfer apparatus of the present embodiment.

FIGS. 10 and 11 illustrate the operation of the control register 24 and the information buffer 22 employed by the input/output control circuit 21 and the write control circuit 23 of the information recording unit 2 shown in FIG. 7.

In the present example, the control register 24 is made up of S registers, S1, S2 and S3, holding information block numbers for starting the writing in the recording media $31_1$, $31_2$ and $31_3$, P registers, P1, P2 and P3, indicating for the recording media $31_1$, $31_2$ and $31_3$ the information block numbers to be written next, Q registers Q1, Q2 and Q3 for holding the information block numbers to be transferred next from the information transfer apparatus 1 to the recording media $31_1$, $31_2$ and $31_3$ and a T register indicating whether or not a transfer demand has been made.

If the information transfer demand signal is outputted from the information recording unit 2 to the information transfer apparatus 1, the T register is set to the state TRUE, that is set to 0 (TRUE=0). If the information transfer is no longer necessary, the T register is set to the state FALSE, that is set to 1 (FALSE=1).

The information buffer 22 is a so-called ring buffer in which the information of the information blocks transmitted from the information transfer apparatus 1 is recorded cyclically, as shown in FIG. 11. In the present embodiment, the buffer length L=12, representing four consecutive buffers 61 to 64 each having a buffer length L=3. That is, the information of an information block transferred from the information transfer apparatus 1 is transiently stored in the information buffer 22 before being written in the three recording media $31_1$, $31_2$ and $31_3$, as discussed above. In the present embodiment, the information block transferred after storage in the 11th address (b11) of the buffer 22 is again stored in the 0'th address. In the present embodiment, information data $D_{22}$, $D_{23}$, $D_{24}$, $D_{21}$ of the information blocks to be written in the recording medium $31_1$ are stored in the 0'th address (b0), third address (b3), sixth address (b6) and the ninth address (b9) of the information buffer, respectively, while the information data $D_{84}$, $D_{85}$, $D_{86}$, $D_{83}$ of the information blocks to be written in the recording medium $31_2$ are stored in the first address (b1), fourth address (b4), seventh address (b7) and the tenth address (b10) of the information buffer, respectively, and the information data $D_{146}$, $D_{147}$, $D_{144}$, $D_{145}$ of the information blocks to be written in the recording medium $31_3$ are stored in the second address (b2), fifth address (b5), eighth address (b8) and the 11th address (b11) of the information buffer, respectively.

Among the information data of the information blocks stored in the information buffer 22, the information data of the information blocks shown shaded in FIG. 11 indicate that writing in the associated recording medium has been completed, that is that writing of the information data $D_{145}$, $D_{83}$, $D_{21}$, $D_{144}$, $D_{23}$, $D_{146}$, $D_{22}$ has been completed. It may be seen from the values of the registers S1 to S3 and P1 to P3 of the registers S and P, that is R0, R24; R62, R84; and R124, R147, that writing of the information data of the 0'th to 23rd information blocks in the recording medium $31_1$, 62nd to 83rd information blocks in the recording medium $31_2$ and the 124th to 146th information blocks in the recording medium $31_3$ has been completed, as shown in FIG. 10.

It may also be seen from the values of the registers Q1 to Q3 in the Q register, that is R25, R87 and R148 that up to the 24th information block recorded in the recording medium $31_1$, up to the 86th information block recorded in the recording medium $31_2$ and up to the 147th information block recorded in the recording medium $31_3$, have already been stored in the information register 22, as shown in FIG. 10.

In this state, the address in the information buffer 22 in which to store the information data of the information block transferred from the information transfer apparatus 1 is (A+1) provided that the value of the Q-register for which the values (Q1−S1), (Q2−S2) and (Q3−S3) of the control register are maximum and the recording medium number maximum is X and the address of the information buffer 22 in which the (X−1)th information block is stored is A. In the present embodiment, it is seen that information data of the 148th information block is stored at the 8th address (b8).

If, in this state, the value of the P-register for which the values (P1−S1), (P2−S2) and (P3−S3) of the control register 24 are minimum and the recording medium number is minimum is Y and the address of the information buffer 22 in which the Y'th information block is stored is B, writing of the information data in the recording medium is completed up to the (B−1)th block, that is up to the 0'th information block. Consequently, new information data may be transferred to consecutive addresses of from the (A+1)th address up to the (B−1)th address for storage therein. In short, in the present embodiment, information data of the 148th information block, 25th information block, 87th information block, 149th information block and the 26th information block may be transferred from the 8th address (b8), 9th address (b8), 10th address (b8), 11th address (b8) and the 0'th address of the information buffer 22 for storage therein, respectively.

Figure 12:
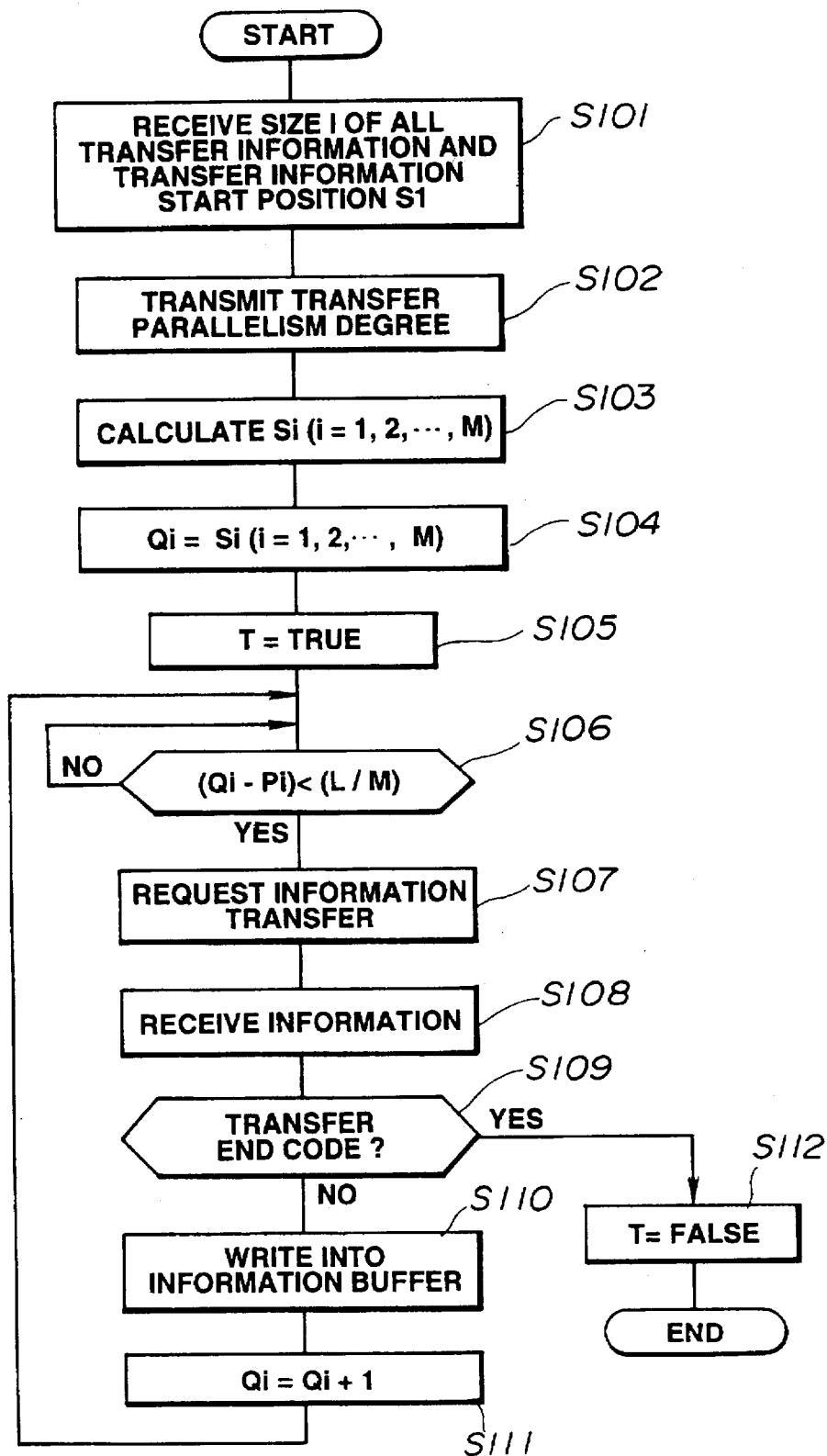
FIG. 12 is a flow chart showing the processing flow in an input/output control circuit of the information recording unit of the present embodiment.

Next, the processing in the input output control circuit 21 of the information recording unit 2 embodying the present invention is explained by referring to the flow chart of FIG. 12.

The user of the information recording unit 2 first selects the information to be transferred from the information transfer apparatus 1. Such selection may be made by the user thrusting a button switch, not shown, provided at an input unit 415 of the information transfer apparatus 1 (see FIG. 15).

The information transfer apparatus 1 has the memory management information, such as the information start position S1 for the selected information or the information quantity I, and transmits the information S1 and I to the information recording unit 2 responsive to such selection. Consequently, the input/output control circuit 21 is responsive to the transmission to receive the start position S1 and the information quantity I at a step S101.

At the next step S102, the degree of parallelism M of the information transfer control is transmitted from the information recording unit 2 to the information transfer apparatus 1. The degree of parallelism M indicates the number of the recording media required for recording the transfer information.

Thus it is possible for the information transfer apparatus 1 and the information recording unit 2 to calculate, from the information quantity I of the selected transfer information and the number M of the recording media required for recording the transfer information, the information quantity J recorded in each recording medium as the information quantity I divided by the degree of parallelism M. Thus it becomes possible to find the number of the first transfer information in each recording medium Si (i=1, 2, ..., M) from the start position S1 of the selected transfer information and the information quantity J. However, the information quantity J is not to surpass the information quantity corresponding to the recording capacity of each recording medium less the capacity of the memory area susceptible to exceptional recording as described above.

That is, in the embodiment of FIGS. 10 and 11, it is possible for the information recording unit E to transmit M=3 to the information transfer apparatus 1 after receiving S1=0 and I=186 from the information transfer unit 1, to thereby find J=62 in both the information transfer apparatus 1 and the information recording unit 2, and hence to find S1=0, S2=S1+J=62 and S3=S2+J=124. Similar processing is possible by transmitting a previously found information quantity J to the information transfer apparatus 1 in place of the degree of parallelism M In addition, by previously transmitting the magnitude of the information block in the information transfer to the information transfer apparatus at the initializing step, it becomes possible to cope with a variety of the information recording units constituted by a variety of types of the recording media.

At the next steps S104 and S105, the number of the next transfer information to the recording media Qi is set so that Qi=Si (i=1, 2, ..., M) by way of initialization, while T is set so that T=TRUE. Transfer control is started under these conditions.

At the next step S106, it is checked whether or not the information at the (A+1)th address in the information buffer in which to store the next transfer information from the above information transfer apparatus 1 is already written in the associated recording medium. This may be achieved by checking whether or not (Q1−P1) is lesser than (L/M) in the associated recording medium $31j$ (j=1, 2, ..., N). In the embodiment of FIGS. 10 and 11, since Q3−P3=148−147=1 in the information data $D_{144}$ of the eighth address is smaller than $12/3=4$, it is seen that writing is completed in the recording medium $31j$ (j=3) so that the next transfer information data can be stored therein. If it is found at the step S106 that no storable area is procured in the information buffer 22 (the result is NO), the step S106 is repeated until the storable area is procured. During this time, the writing control circuit 23 executes the writing of the information block from the information buffer 22 to the recording medium. If, as a result, the storable area is procured in the information buffer 22 (the result is YES), a demand is raised at the next step S107 to the information transfer apparatus for transferring the information block.

Thus the Qi'th information block to be written from the storable area in the recording medium $i$ is transferred from the information transfer apparatus 1. At the next step S108, the transferred information block is received. At the next step S109, it is checked whether or not the received information block is the transfer end code. If the result is NO, that is if the information block is not the transfer end code, the information block is stored at the next step S110 in the information buffer 22, and the value of Qi is updated at the next step S111. Processing then returns to the step 106 to repeat the above sequence of processing operations.

That is, in the examples of FIGS. 10 and 11, the 148th information block transferred by the transfer demand is stored in the eighth address of the information buffer 22 as described above, and the Q3 value is updated to 149.

On the other hand, if the result of the above check at the step S109 is YES, that is if the transfer end code is received, the contents of the T register is changed to FALSE in order to enable the write control circuit 23 to recognize that no new information will be transferred further. The input/output control operation then comes to a close.

Figure 13:
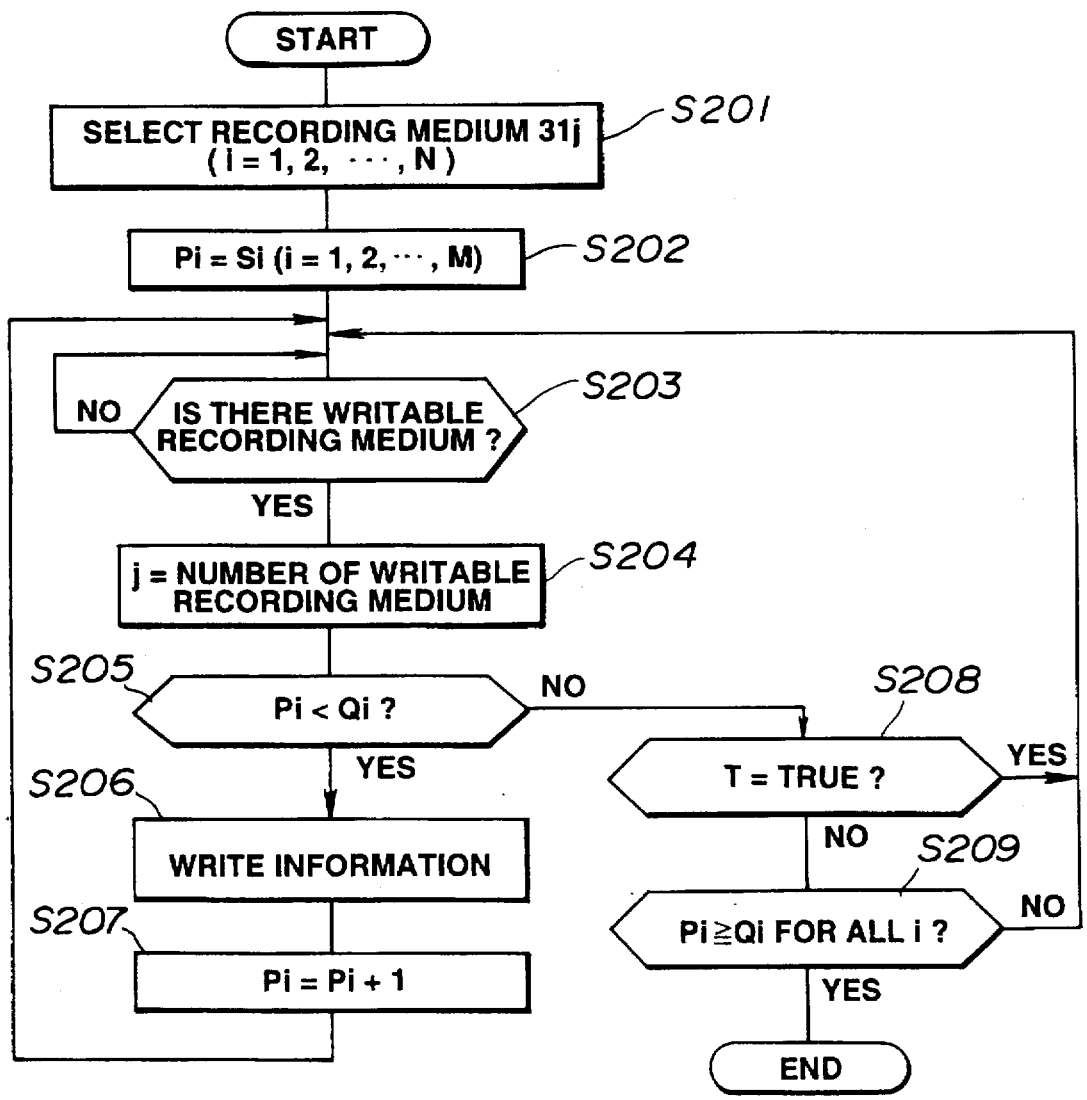
FIG. 13 is a flow chart illustrating the processing carried out by the write control circuit 23 of the embodiment of FIG. 7.

The processing in the write control circuit 23 of the information recording unit 2 of the present embodiment is now explained by referring to the flow chart of FIG. 13.

At a step S201, the writing control circuit 23 selects the recording medium $31j$ (j=1, 2, ..., N). Selection of the recording medium $31j$ may be made simply in the sequence of the numbers of the recording media, or such recording medium $31j$ may be selected in which no information or unnecessary information has been recorded.

At the next step S202, Si (i=1, 2, ..., M) found as at the step S103 of the input/output control circuit 21 is set as the information block number in each recording medium $31j$ which is selected at the previous step S201 in which the information data is written first.

That is, in the examples of FIGS. 10 and 11, all of the three recording media $31_1$, $31_2$, $31_3$, are selected (M=3). Then, among the information blocks recorded in the recording media in the information transfer apparatus 1, the 0'th, 62nd and 124th information blocks are set as the initial information blocks in the recording media $31_1$, $31_2$ and $31_3$. That is, at the step S202, the P register is set so that P1=0, P2=62 and P3=124. It is of course possible to select only two of the three recording media $31_1$, $31_2$ and $31_3$ (M=2), in which case the register associated with the non-selected recording medium is invalidated, at the same time as the information indicating which of the recording media remains unselected is sent to a voltage control circuit 61. The voltage control circuit 61 lowers the supply voltage to the non-selected recording medium for suppressing the power consumption. The above control of lowering the supply voltage is valid even during the information readout operation thus rendering it possible to suppress the power consumption in the recording medium not being read out.

At the next step S203, it is checked whether on not there is any recording medium, among the recording media selected at the step S201, which is in the writable state. If the result is NO, that is if there in no such recording medium, the operation of Step S203 is repeated until the writable state is reached.

If the result is YES, that is if there is such writable recording medium, the recording medium $31j$ in which writing is actually performed is determined at the next step S204. To this end, it is only sufficient if the register Pi (i=1, 2, ..., M) associated with the selected recording media is checked and the recording medium $31j$ associated with the register Pi having the minimum value is selected.

At the next step S205, the selected Pi value is compared to the associated Qi value. If the Pi value is less than the Qi value, it is indicative that the information block indicated by the Pi value has already been stored in the information buffer. Thus, at the next step S206, writing in the recording medium $31j$ associated with the value i is made. After the end of writing, the register Pi is updated at the step S207. Processing then returns to the step S203 to repeat the above processing steps.

If the Pi value is found at the step S205 to be larger than the Qi value, the information block to be written is as yet not transferred to the information buffer 22. Thus, at the next step S208, it is checked by the T register whether or not new information data is transmitted from the information transfer apparatus 1.

If T=TRUE (YES), it is probable that new information will be transmitted further, so that processing returns to the step S203 to repeat the above processing operations. On the contrary, if T=FALSE (NO), there is no possibility of new information being transmitted further. Thus, as the next step S209, it is checked whether or not the information blocks stored in the information buffer 22 have been written in their entirety in the associated recording media.

If it is found at the step S209 that writing has been completed in its entirety (YES), the write control operation comes to a close. If there is any information block yet to bewritten (NO), processing returns to the step S203 to repeat the above processing.

It is assumed that, in FIGS. 12 and 13, the start timing of step S102, the end timing of step S105 and end timing of S103 are synchronized with the end timing of step S201, the end timing of step S202 and the start timing of step S203, respectively. Such synchronization can be achieved relatively easily.

Although the input/output control circuit 2 and the writing control circuit 23 are shown separately from each other in FIG. 7, it is of course possible for the sole control means of a unified hardware structure to have the above-described functions, whereby the operations of the input/output control circuit 21 and the writing control circuit 23 can be synchronized relatively easily.

One of the crucial features of the present invention is periodicity in the transfer sequence of the information blocks. This eliminates the necessity of designating from the information recording unit 2 to the information transfer apparatus 1 which number information block should be transmitted for each transfer operation. Thus a 1-bit pulse signal suffices as the information transfer demand signal from the information recording unit 2 to the information transfer apparatus 1. This is effective even with different memory configurations of the information recording unit 2, so that information transfer to a variety of information recording units may be realized by the method of the present invention.

Another crucial feature of the present invention is that, by selecting during information transfer the recording medium in which to write information data during the information transfer operation, the information transfer to a required minimum number of the recording media may be achieved. This reduces the number of times of the chip selecting operations usually required in the recording medium. In addition, information transfer may be achieved in a shorter time interval as compared to the case wherein the transfer of information lies across a number of the recording media. In the case of a flash EEPROM, for example, the number of times of chip erasure becomes larger than that of block erasure, as the erasure operations required before the writing of the information, so that the erasure time and consequently the time required in the information transfer is diminished. On the other hand, by setting the low power consumption mode, that is the sleep mode, for the non-selected recording medium, the power consumption of the information recording unit may be achieved.

Still another crucial feature of the present invention is that, since the information block numbers of the respective recording media are consecutive as a result of the information transfer, memory management may be facilitated n the control operations for the information readout, erasure or editing operations subsequent to the information transfer. The continuous information block numbers in each recording medium enables the information to be read out speedily by the required minimum number of times of the chip selecting operations and sets the low power consumption state for the recording medium not currently being read out, thus enabling the power consumption to be lowered. Consequently, high-speed information transfer may be achieved even when the information is to be transferred to a further information recording unit.

The utility of the information buffer is now explained. If there is no information buffer provided in the information recording unit, the information transferred in a regular sequence is directly written in the recording medium. If a recording time more than is usually required is consumed in writing the information in the recording medium, the information to be written in the recording medium and any subsequent information become unable to be transferred from the information transfer apparatus.

Consequently, by providing the above-described information buffer, it becomes possible to resolve the above-described inconveniences which will arise when writing information signals in parallel on a large number of recording media. That is, before the writing in a recording medium associated with the information block of a certain number comes to a close, the information recording unit receives the information blocks of the subsequent numbers from the information transfer apparatus and stores the information blocks in the information buffer, so that parallel writing in further recording media may be achieved.

If the information buffer is full, information transfer is interrupted. However, in the case of the EEPROM, the writing time in a majority of memory devices undergoes relatively small variation, so that, if the write time is averaged over a number of the memory blocks, writing within a substantially uniform write time becomes possible. Consequently, by the information buffer having a sufficient capacity to absorb variation in the write time, there is only a little risk of interruption of the information transfer and hence the overall write time, that is the transfer time, may be reduced.

The information buffer 22 may be configured in other constructions than that shown in FIGS. 10 and 11. FIG. 14 shows an exemplary construction employing an alternative information buffer.

In the present example, the information buffers 311, 312 and 313 are separately mounted for the recording media 321, 322 and 323, respectively. Each of the information buffers 311, 312 and 313 is a FIFO buffer in which the information is outputted in the sequence in which it is entered. However, the control which the input/output control circuit 301 and the write control circuit 303 perform using the control register 302 is the same as that described above. The input/output control circuit 301 distributes the information blocks transferred from the information transfer apparatus 1 to the information buffers 311, 312 and 313. The manner in which the information blocks are distributed to the information buffers may be easily determined by the numbers of the information blocks, that is the sequence in which the information blocks have been transferred.

With the present embodiment, as described above, since there is certain periodicity at all times in the sequence in which the information is transferred to a variety of the information recording media having diverse memory configurations, it is possible to read out the information previously from the recording medium in the information transfer apparatus to store the read-out information in the buffer memory. Consequently, simplified control processing suffices to read out the information from plural recording media of low readout velocity as the large-capacity recording media enclosed in the information transfer apparatus, arrayed in parallel, store the read-out information in a buffer memory which permits high-speed information readout and writing and to subsequently transfer the information from the buffer memory to the information recording unit.

Figure 15:
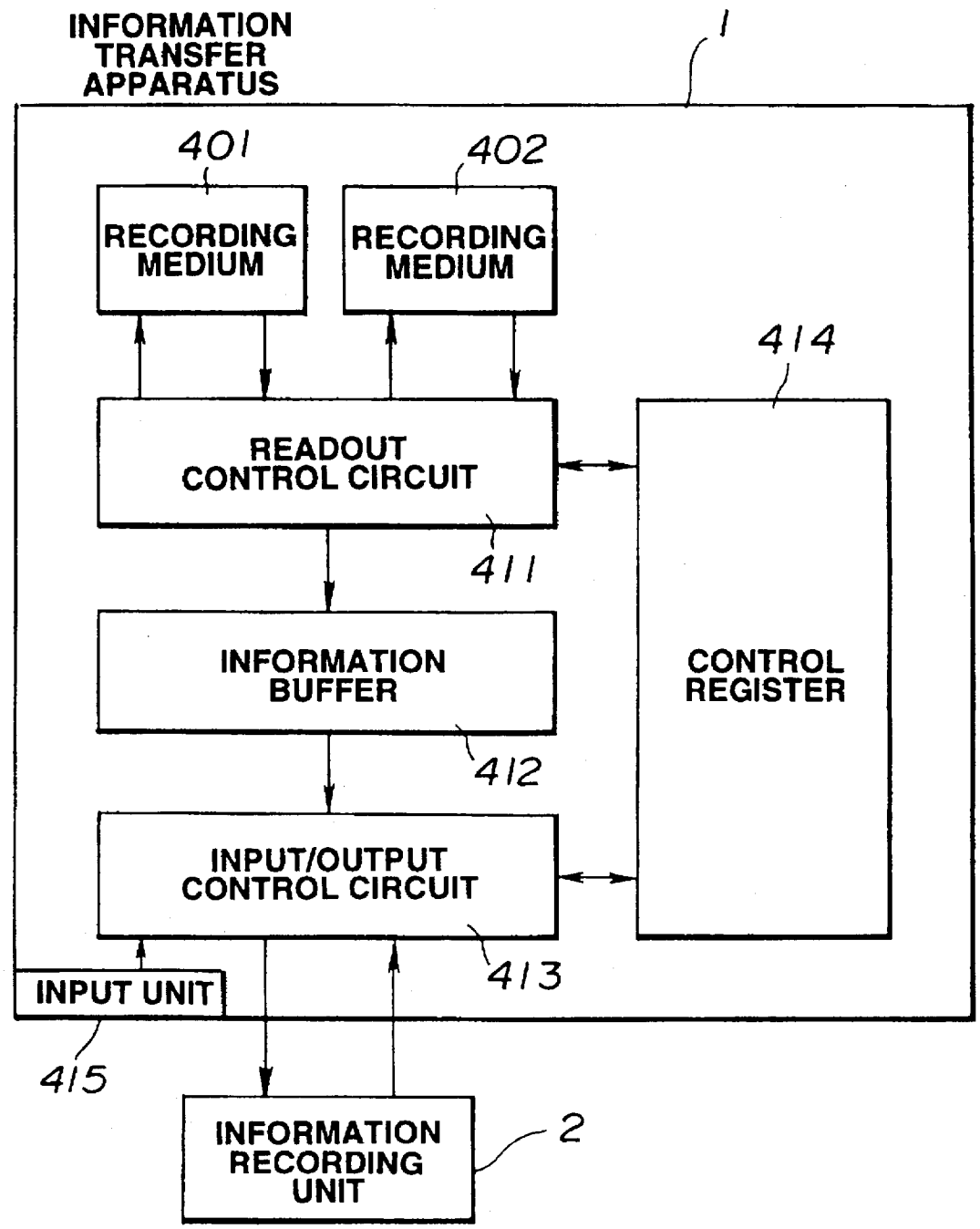
FIG. 15 is a block diagram for use in explaining a preferred embodiment of the information transfer apparatus according to the invention.

Referring to FIG. 15, a preferred embodiment of the information transfer apparatus, having the above-described buffer memory, is now explained.

In FIG. 15, a control register 414 holds a number A of an information block to be transferred next to the information recording unit 2, a number B of an information block to be written next in an information buffer 412 and the magnitude C of the entire information to be transferred.

Prior to the information transfer, the user thrusts a button switch, not shown, of an input unit 415 to designate the information desired to be transferred from the information transfer apparatus i to the information recording unit 2. The input unit 415 then transmits the discrimination information associated with the transfer information to an input/output control circuit 41B. Based upon the discrimination information, the input/output control circuit 413 sets the information quantity I of the associated transfer information to C, while setting the values of the start position S1 of the information to A and B. These values are stored in the control register 414. The input/output control circuit 413 transmits the information I of the transfer information and the start position S1 of the transfer information to the information recording unit 2. The input/output control circuit 413 then receives the information indicating the degree of parallelism M of the information transfer from the information recording unit 1 and determines the regular transfer sequence of the information blocks based upon the degree of parallelism M, information quantity I and the start position S1 as described above. The information quantity J recorded in each recording medium may also be transmitted from the recording unit 1 in place of the degree of parallelism, as described above.

The input/output control circuit 413 then checks the control register 414 each time the information transfer request signal is issued from the information recording unit 2. If the A'th information block stored in the information buffer 412 has as yet not been transferred, the control circuit 413 causes the block to be transmitted to the information recording unit 2 to update the value for A. The readout control circuit 411 checks the control register 414 and, if there is any vacant area in the information buffer 412, reads out the B'th information block from the recording medium 401 or the recording medium 402 to store the read-out information block in the information buffer 412 to update the value for B. The above-described control operations are repeated until the transfer of the transfer quantity C in its entirety comes to a close.

If the information buffer 412 is mounted within the information transfer apparatus 1, as shown in FIG. 15, it is also possible to eliminate the information buffer in the information recording unit 2 shown in FIG. 7 and to directly write in each recording medium the information blocks transferred from the information transfer apparatus 1 based upon the information transfer request signal from the information recording unit 2.

In FIGS. 7 and 15, the information to be exchanged between the information transfer apparatus 1 and the information recording unit 2 may be exchanged time-divisionally for reducing the number of signal lines taking charge of the information transmission between the information transfer apparatus 1 and the information recording unit 2.

The present embodiment may be adapted to any of the constructions of FIGS. 1 to 4. Besides, although the above description has been made taking the case of transferring the audio information from the information transfer apparatus shown in FIG. 3 to the information recording unit, the present invention may be adapted to information transfer from an information transfer apparatus in general to an information recording unit. The type of the information may also encompass the recording of the information other than the audio information without departing from the scope of the invention. It is also possible to regard the information recording unit which has once received the information as a new information transfer apparatus and to transmit the information from this apparatus to another information recording unit. In such case, the information buffer may be simultaneously employed during writing and readout for lowering the costs of the unit.

If a semiconductor memory or a disc-shaped recording medium capable of random accessing is employed as a recording medium in the information recording medium, the effect of high-speed information transfer may be achieved. In addition, by employing a non-volatile memory, there is no necessity of providing a power source for holding the information, thus rendering it possible to further reduce the size of the recording unit. Information re-writing is facilitated by employing an electrically rewritable non-volatile memory, such as a flash memory. The same may be said of a recording medium in the information transfer apparatus. It is possible to employ a read-only recording medium, e.g. an optical disc, in which case the apparatus may be reduced in cost.

What is claimed is:

1. An apparatus for transferring information comprising:

a recording medium having transfer information recorded thereon, and transfer control means for determining a transfer sequence of plural information blocks when the transfer information recorded on said recording medium is read out as said information blocks based upon a transfer control information received from an information recording unit, said transfer control means transmitting said information blocks to said information recording unit in accordance with the determined transfer sequence; and wherein said transfer control information includes an information indicating the degree of parallelism of transfer and wherein said transfer control means determines said transfer sequence based upon an information quantity of the transfer information and the degree of parallelism of the transfer.

2. An apparatus for recording transfer information transferred thereto comprising:

a plurality of recording media for recording the transfer information transferred from an information transfer apparatus;

writing control means for controlling the writing of the transfer information in said recording media;

transfer control means for transmitting transfer control information and an information transfer request signal to said information transfer apparatus, said transfer control information being information for determining a transfer sequence of information blocks when said information transfer apparatus transmits said transfer information as said information blocks; and wherein said transfer control information includes information indicating the degree of parallelism of transfer.

3. An apparatus for recording transfer information transferred thereto comprising:

a plurality of recording media for recording the transfer information transferred from an information transfer apparatus;

writing control means for controlling the writing of the transfer information in said recording media;

transfer control means for transmitting transfer control information and an information transfer request signal to said information transfer apparatus, said transfer control information being information for determining a transfer sequence of information blocks when said information transfer apparatus transmits said transfer information as said information blocks; and wherein said transfer control means calculates the number of a first information block recorded by the recording media based upon an information of transfer parallelism, an information indicating the volume of the transfer information transmitted from the information transfer apparatus and an information indicating a start position of the transfer information.

4. An apparatus for recording information transferred thereto from a source comprising:

a plurality of memories for recording the information transferred from the source, writing control means for controlling the writing of the information in the memories, and transfer control means for transmitting control information and an information request signal to the source, the control information being information for setting a sequence of information blocks when the source transmits the information in the information blocks, wherein the transfer control information includes information indicating the degree of parallelism of transfer, the quantity of the information recorded by each memory, and the magnitude of the information block.

5. The apparatus as claimed in claim 4 wherein the transfer control means calculates the number of a first information block recorded by the memories based upon an information of transfer parallelism, an information indicating the volume of the information transmitted from the source and an information indicating a start position of the information.

6. The apparatus as claimed in claim 4 wherein the writing control means selects one of the memories in which to record the information and lowers an impressed voltage to the memories other than the selected memory.

7. The apparatus as claimed in claim 4 further comprising a register for storing the number of each of the first information blocks recorded by the memories.

8. The apparatus as claimed in claim 4 wherein the memories are semiconductor memories.

* * * * *